United States Patent
Kuroki et al.

(10) Patent No.: US 12,385,989 B2
(45) Date of Patent: Aug. 12, 2025

(54) MAGNETIC SENSOR AND MANUFACTURING METHOD THEREFOR

(71) Applicant: TDK Corporation, Tokyo (JP)

(72) Inventors: Koji Kuroki, Tokyo (JP); Chengbin Lin, Tokyo (JP)

(73) Assignee: TDK Corporation, Tokyo (JP)

( * ) Notice: Subject to any disclaimer, the term of this patent is extended or adjusted under 35 U.S.C. 154(b) by 170 days.

(21) Appl. No.: 18/548,969

(22) PCT Filed: Feb. 22, 2022

(86) PCT No.: PCT/JP2022/007193
§ 371 (c)(1),
(2) Date: Sep. 5, 2023

(87) PCT Pub. No.: WO2022/190854
PCT Pub. Date: Sep. 15, 2022

(65) Prior Publication Data
US 2024/0069126 A1 Feb. 29, 2024

(30) Foreign Application Priority Data

Mar. 12, 2021 (JP) ................................ 2021-039872

(51) Int. Cl.
*G01R 33/09* (2006.01)
(52) U.S. Cl.
CPC .................... *G01R 33/09* (2013.01)
(58) Field of Classification Search
CPC .................................................... G01R 33/09
See application file for complete search history.

(56) References Cited

U.S. PATENT DOCUMENTS 4,385,273 A * 5/1983 Lienhard ................ G01R 33/05
324/249
2018/0335485 A1 11/2018 Masuda

FOREIGN PATENT DOCUMENTS

| JP | 01-200682 A | 8/1989 |
| JP | 04-078583 A | 7/1992 |

(Continued)

OTHER PUBLICATIONS

Silva,M. et al. "Optimization of the Gap Size of Flux Concentrators: Pushing Further on Low Noise Levels and High Sensitivities in Spin-Valve Sensors", IEEE Transactions on Magnetics, vol. 55 No. 7, Jul. 2019. (Year: 2019).*

(Continued)

*Primary Examiner* — Alesa Allgood
(74) *Attorney, Agent, or Firm* — Rimon P.C.

(57) ABSTRACT

A sensor chip of a magnetic sensor includes a magnetosensitive element, ferromagnetic films forming a magnetic gap overlapping the magnetosensitive element, and a passivation film provided on the ferromagnetic films so as to be filled in the magnetic gap. The ferromagnetic films each include a lower magnetic film and an upper magnetic film. The magnetic gap is configured such that a width between the upper magnetic films is larger than a width between the lower magnetic films. The material of the lower magnetic film is higher in permeability than the material of the upper magnetic film. With the above configuration, magnetic flux is efficiently applied to the magnetosensitive element, making it possible to achieve high detection sensitivity.

7 Claims, 6 Drawing Sheets

(56) References Cited

FOREIGN PATENT DOCUMENTS

| JP | 10-300831 A | 11/1998 |
| JP | 2007-278734 A | 10/2007 |
| JP | 2018-194534 A | 12/2018 |
| JP | 2018-200307 A | 12/2018 |
| JP | 2019-219182 A | 12/2019 |
| WO | 01/46708 A1 | 6/2001 |

OTHER PUBLICATIONS

International Search Report issued in corresponding International Patent Application No. PCT/JP2022/007193, dated Apr. 12, 2022, with English translation.
Extended European Search Report dated Feb. 4, 2025, issued in corresponding European Patent Application No. 22766816.7, 10 pages.
Silva, M. et al. "Optimization of the Gap Size of Flux Concentrators: Pushing Further on Low Noise Levels and High Sensitivities in Spin-Valve Sensors", IEEE Transactions on Magnetics, vol. 55. No. 7, Jul. 2019.

* cited by examiner

MAGNETIC SENSOR AND MANUFACTURING METHOD THEREFOR

CROSS REFERENCE TO RELATED APPLICATIONS

This application is the U.S. National Phase under 35 U.S.C. § 371 of International Application No. PCT/JP2022/007193, filed on Feb. 22, 2022, which claims the benefit of Japanese Patent Application No. 2021-039872, filed on Mar. 12, 2021, the entire contents of each are hereby incorporated by reference.

TECHNICAL FIELD

The present invention relates to a magnetic sensor and a manufacturing method therefor and, more particularly, to a magnetic sensor provided with a ferromagnetic film for collecting magnetic flux in a magnetosensitive element and a manufacturing method for such a magnetic sensor.

BACKGROUND ART

Patent Document 1 discloses a magnetic sensor provided with a ferromagnetic film for collecting magnetic flux in a magnetosensitive element. For example, a configuration in which the ferromagnetic film is formed in a two-layer structure is illustrated in FIG. 20 of Patent Document 1.

CITATION LIST

Patent Document

[Patent Document 1] JP 2019-219182A

DISCLOSURE OF THE INVENTION

Problem to be Solved by the Invention

However, a multilayer structure of the ferromagnetic film may fail to obtain sufficient detection sensitivity or may disadvantageously cause variations in detection sensitivity depending on a magnetic material or a film formation method to be used.

It is therefore an object of the present invention to provide an improved magnetic sensor provided with a ferromagnetic film having a multilayer structure and a manufacturing method therefor.

Means for Solving the Problem

A magnetic sensor according to the present invention includes: a magnetosensitive element whose magnetic sensing direction is a first direction; an insulating film covering the magnetosensitive element; first and second ferromagnetic films provided on the insulating film so as to be separated from each other; and a passivation film provided on the first and second ferromagnetic films so as to filled a separated part between an end portion of the respective first ferromagnetic film and an end portion of the respective first ferromagnetic film. The magnetosensitive element overlaps the separated part in a plan view. Each of the first and second ferromagnetic films includes a lower magnetic film provided on the surface of the insulating film and an upper magnetic film provided on the lower magnetic film. The separated part is configured such that the width in the first direction of the separated part between the upper magnetic films is larger than the width in the first direction of the separated part between the lower magnetic films. The material of the lower magnetic film is higher in permeability than the material of the upper magnetic film.

According to the present invention, the material of the lower magnetic film is higher in permeability than the material of the upper magnetic film, so that magnetic flux is efficiently applied to the magnetosensitive element. This makes it possible to achieve high detection sensitivity.

In the present invention, the lower magnetic film and the upper magnetic film may directly contact each other not through a film made of another metal material. This reduces a magnetic resistance between the lower magnetic film and the upper magnetic film, making it possible to achieve higher detection sensitivity.

A manufacturing method for the magnetic sensor according to the present invention includes: a first step of covering a magnetosensitive element whose magnetic sensing direction is a first direction with an insulating film; a second step of forming lower magnetic films of respective first and second ferromagnetic films on the insulating film using a sputtering method; a third step of forming upper magnetic films of the respective first and second ferromagnetic films on the lower magnetic films of the respective first and second ferromagnetic films by electrolytic plating; and a fourth step of forming a passivation film on the first and second ferromagnetic films. In the second step, the lower magnetic film is formed such that one end portion of the magnetosensitive element in the first direction overlaps, in a plan view, the lower magnetic film of the first ferromagnetic film, that the other end portion of the magnetosensitive element in the first direction overlaps, in a plan view, the lower magnetic film of the second ferromagnetic film, and that an area between the one end portion of the magnetosensitive element and the other end portion thereof does not overlap the lower magnetic films of the respective first and second ferromagnetic films. In the third step, the upper magnetic film is formed such that the separation width in the first direction between an end portion of the upper magnetic film of the first ferromagnetic film and an end portion of the upper magnetic film of the second ferromagnetic film is larger than the separation width in the first direction between an end portion of the lower magnetic film of the first ferromagnetic film and an end portion of the lower magnetic film of the second ferromagnetic film.

According to the present invention, the lower magnetic film is formed by a sputtering method, so that position accuracy with respect to the magnetosensitive element is enhanced. This can reduce variations in detection sensitivity among products. In addition, the upper magnetic film is formed by electrolytic plating, so that a sufficient film thickness can be obtained in a short period of time.

In the third step, the electrolytic plating may be performed using the lower magnetic film as a seed layer. This avoids a seed layer made of another metal material from being interposed between the lower and upper magnetic films, thereby reducing a magnetic resistance between the lower and upper magnetic films, which can achieve higher detection sensitivity.

In the fourth step, the passivation film may be formed by a sputtering method. This avoids the magnetosensitive element from being exposed to high temperatures, making it possible to prevent characteristic degradation of the magnetosensitive element.

In the present invention, the material of the lower magnetic film may be higher in permeability than the material of the upper magnetic film. This allows magnetic flux to be efficiently applied to the magnetosensitive element, making it possible to achieve high detection sensitivity.

Advantageous Effects of the Invention

As described above, according to the present invention, it is possible to enhance detection sensitivity of the magnetic sensor and to reduce variations in detection sensitivity.

MODE FOR CARRYING OUT THE INVENTION

Hereinafter, preferred embodiments of the present invention will be described in detail with reference to the accompanying drawings.

Figure 1:
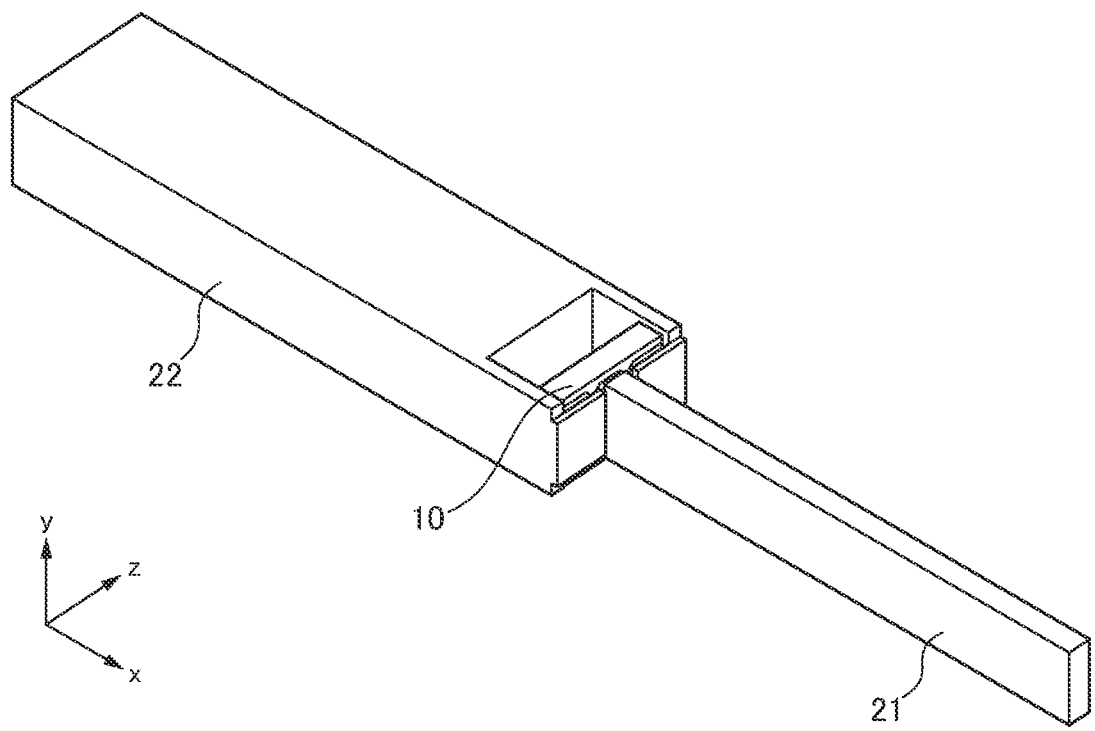
FIG. 1 is a schematic perspective view for explaining the structure of a magnetic sensor 1 according to an embodiment of the present invention.
Figure 2:
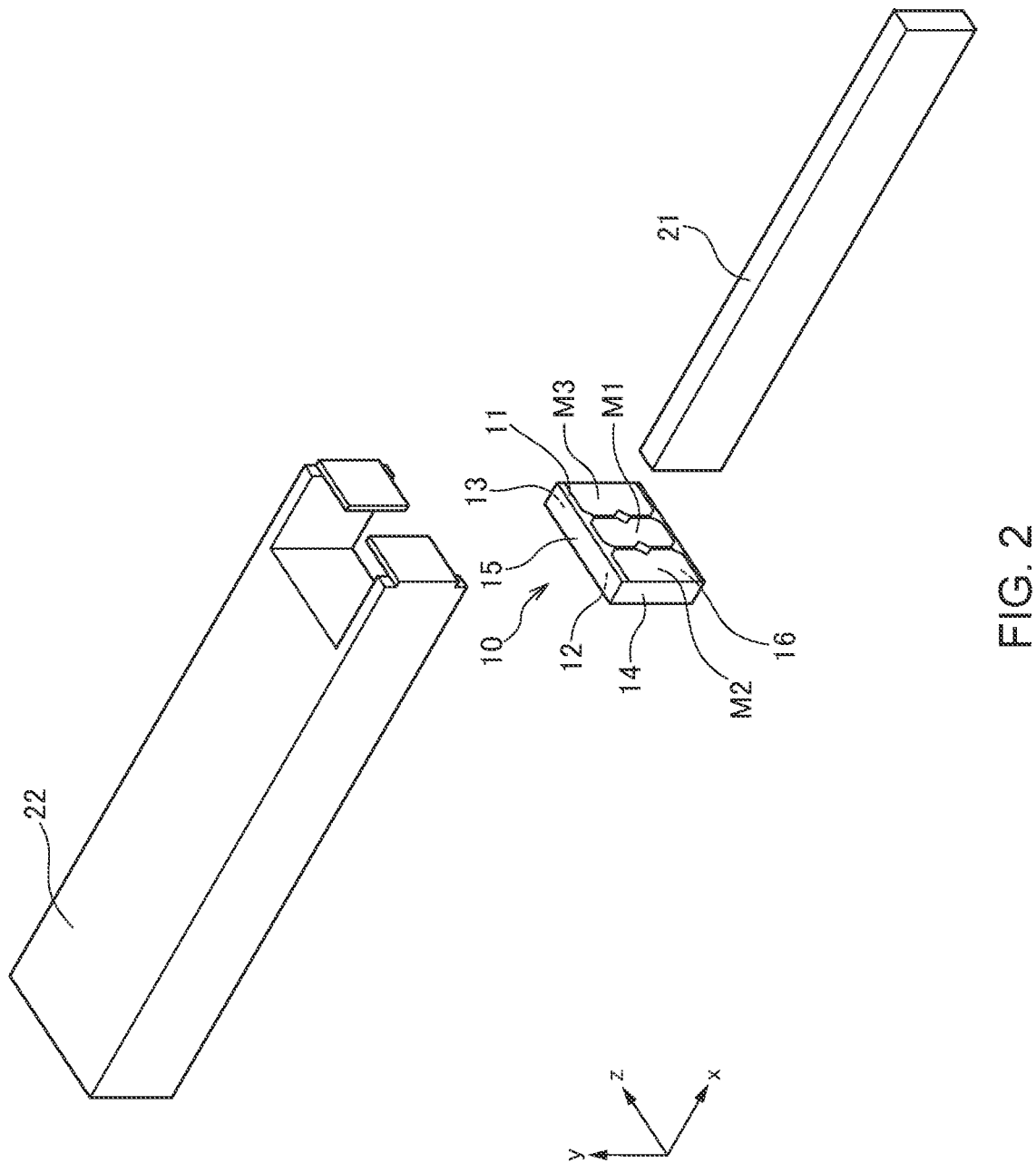
FIG. 2 is a schematic exploded perspective view of the magnetic sensor 1.

FIG. 1 is a schematic perspective view for explaining the structure of a magnetic sensor 1 according to an embodiment of the present invention. FIG. 2 is a schematic exploded perspective view of the magnetic sensor 1.

As illustrated in FIGS. 1 and 2, the magnetic sensor 1 according to the present embodiment includes a sensor chip 10 and external magnetic members 21 and 22 for collecting magnetic flux in the sensor chip 10. The sensor chip 10 has an element forming surface 11 and a back surface 12 which constitute the yz plane, side surfaces 13 and 14 which constitute the xy plane, and side surfaces 15 and 16 which constitute the xz plane. A magnetosensitive element to be described later and ferromagnetic films M1 to M3 are formed on the element forming surface 11 of the sensor chip 10. The external magnetic member 21 has a bar-like shape elongated in the x-direction, and an end thereof in the x-direction is positioned at substantially the center portion of the element forming surface 11 in the z-direction so as to partly cover the ferromagnetic film M1. The external magnetic member 22 has a bar-like shape elongated in the x-direction. The external magnetic member 22 partly covers the ferromagnetic films M2 and M3 and covers also the back surface 12 and side surfaces 13 and 14 of the sensor chip 10.

Figure 3:
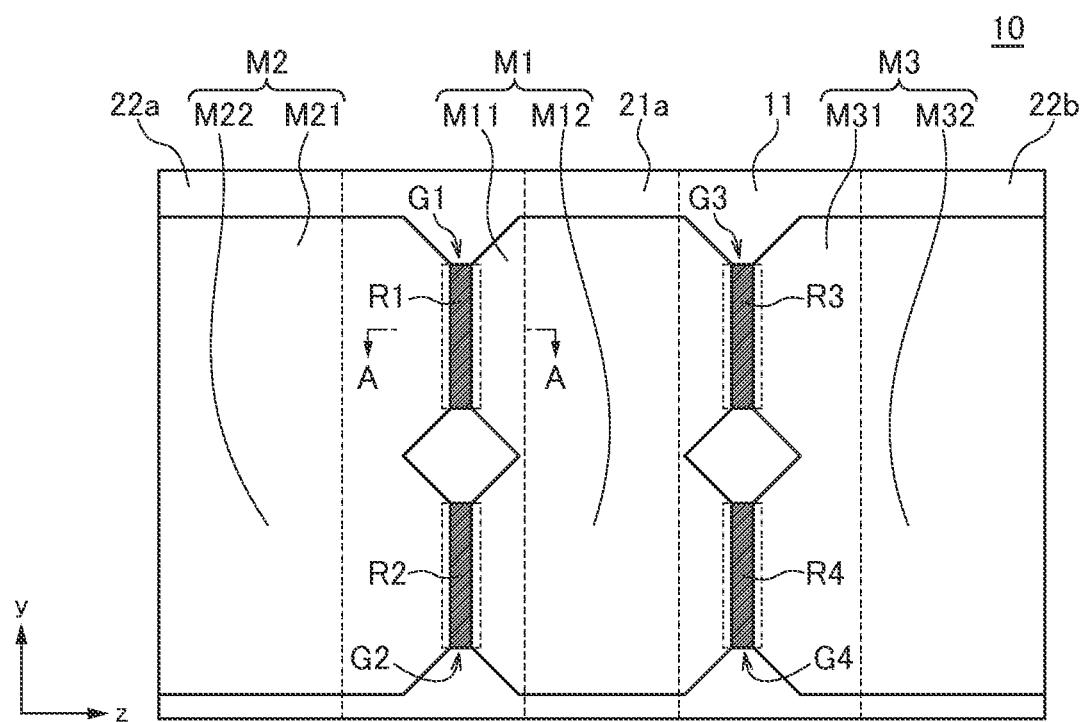
FIG. 3 is a schematic plan view of the sensor chip 10.

FIG. 3 is a schematic plan view of the sensor chip 10.

As illustrated in FIG. 3, four magnetosensitive elements R1 to R4 and three ferromagnetic films M1 to M3 are formed on the element forming surface 11 of the sensor chip 10. The magnetosensitive elements R1 to R4 are not particularly limited in type as long as they are elements whose electric resistance varies depending on the direction of magnetic flux and may be, for example, an MR element. The fixed magnetization directions of the magnetosensitive elements R1 to R4 are the same direction (for example, positive z-direction).

Assume that parts of the respective magnetic layers M1 to M3 that are positioned at one side (upper side in FIG. 3) in the y-direction are defined as ferromagnetic films M11, M21, and M31, and parts of the respective magnetic layers M1 to M3 that are positioned at the other side (lower side in FIG. 3) in the y-direction are defined as magnetic layers M12, M22, and M32. In this case, in a plan view (as viewed in the x-direction), the magnetosensitive element R1 is located at a position overlapping a magnetic gap G1 formed by the ferromagnetic films M11 and M21, the magnetosensitive element R2 is located at a position overlapping a magnetic gap G2 formed by the ferromagnetic films M12 and M22, the magnetosensitive element R3 is located at a position overlapping a magnetic gap G3 formed by the ferromagnetic films M11 and M31, and the magnetosensitive element R4 is located at a position overlapping a magnetic gap G4 formed by the ferromagnetic films M12 and M32. With this configuration, magnetic fields passing through respective magnetic gaps G1 to G4 are applied respectively to the magnetosensitive elements R1 to R4. The direction of the magnetic fields applied respectively to the magnetosensitive elements R1 and R2 and the direction of the magnetic fields applied respectively to the magnetosensitive elements R3 and R4 differ from each other by 180°, so that by bridge-connecting the magnetosensitive elements R1 to R4, the direction and strength of magnetic flux to be applied through the external magnetic member 21 can be detected.

In FIG. 3, the area designated by a reference numeral 21a is an area covered with the external magnetic member 21, and the areas designated by reference numerals 22a and 22b are areas covered with the external magnetic member 22. As illustrated in FIG. 3, the external magnetic member 21 covers the ferromagnetic film M1, and the external magnetic member 22 covers the ferromagnetic films M2 and M3.

Figure 4:
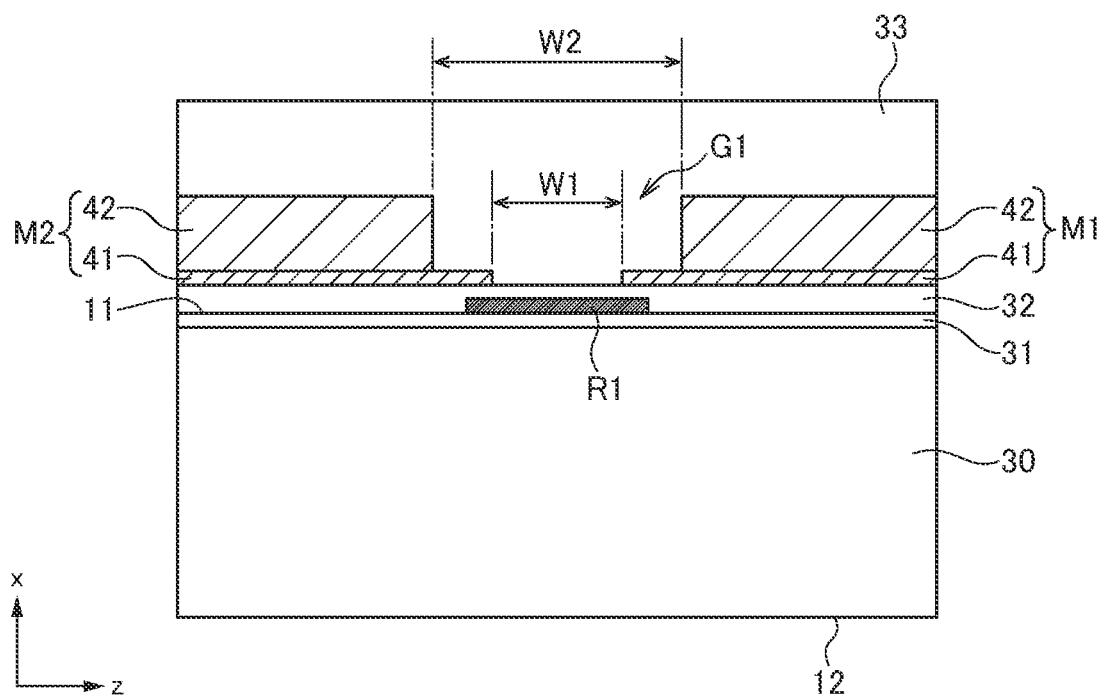
FIG. 4 is a schematic cross-sectional view taken along the line A-A illustrated in FIG. 3.

FIG. 4 is a schematic cross-sectional view taken along the line A-A illustrated in FIG. 3.

As illustrated in FIG. 4, the sensor chip 10 has a substrate 30 and an insulating film 31 provided on the substrate 30, and the surface of the insulating film 31 constitutes the element forming surface 11. The magnetosensitive elements R1 to R4 are provided on the element forming surface 11. The magnetosensitive elements R1 to R4 are covered with an insulating film 32, and the ferromagnetic films M1 to M3 are provided on the surface of the insulating film 32. The ferromagnetic films M1 to M3 are covered with a passivation film 33.

The ferromagnetic films M1 to M3 are each constituted by a lower magnetic film 41 being in contact with the insulating film 32 and an upper magnetic film 42 provided on the lower magnetic film 41. The lower magnetic film 41 and upper magnetic film 42 are made of mutually different materials. The lower magnetic film 41 is higher in permeability than the upper magnetic film 42, and the upper magnetic film 42 is larger in film thickness than the lower magnetic film 41. For example, the lower magnetic film 41 may be made of an NiFe-based material such as permalloy, and the upper magnetic film 42 may be made of a CoFe-based material. The lower magnetic film 41 acts to efficiently apply magnetic flux to the magnetosensitive elements R1 to R4, and the upper magnetic film 42 acts to reduce the total magnetic resistance of the ferromagnetic films M1 to M3.

The lower magnetic film 41 overlaps, in a plan view (as viewed in the x-direction), its corresponding ones of the magnetosensitive elements R1 to R4 at one end thereof in the z-direction. In the cross section illustrated in FIG. 4, one end of the magnetosensitive element R1 in the z-direction overlaps the lower magnetic film 41 constituting the ferromagnetic film M1, and the other end of the magnetosensitive element R1 in the z-direction overlaps the lower magnetic film 41 constituting the ferromagnetic film M2. A part of the magnetosensitive element R1 that does not overlap the lower magnetic film 41 overlaps the magnetic gap G1.

When the separation width in the z-direction of each of the magnetic gaps G1 to G4 between the adjacent lower magnetic films 41 is W1, and the separation width in the z-direction of each of the magnetic gaps G1 to G4 between the adjacent upper magnetic films 42 is W2, W1<W2 is satisfied. With such a configuration, magnetic flux passing through each of the magnetic gaps G1 to G4 concentrates in the edge of the lower magnetic film 41 having high permeability and is thus applied to each of the magnetosensitive elements R1 to R4 efficiently, making it possible to achieve high detection sensitivity. On the other hand, if the lower magnetic film 41 is lower in permeability than the upper magnetic film 42, magnetic flux passing through each of the magnetic gaps G1 to G4 bypasses between the adjacent upper magnetic films 42, resulting in a reduction in the amount of magnetic flux to be applied to each of the magnetosensitive elements R1 to R4. In the present embodiment, since the lower magnetic film 41 uses a material having higher permeability than the upper magnetic film 42, making it possible to suppress a reduction in detection sensitivity due to such a bypass phenomenon.

In addition, the separation width of each of the magnetic gaps G1 to G4 formed by the upper magnetic film 42 is increased to W2, so that even when the separation width W1 is small, the magnetic gaps G1 to G4 can be reliably filled with the passivation film 33, increasing product reliability.

Figure 5:
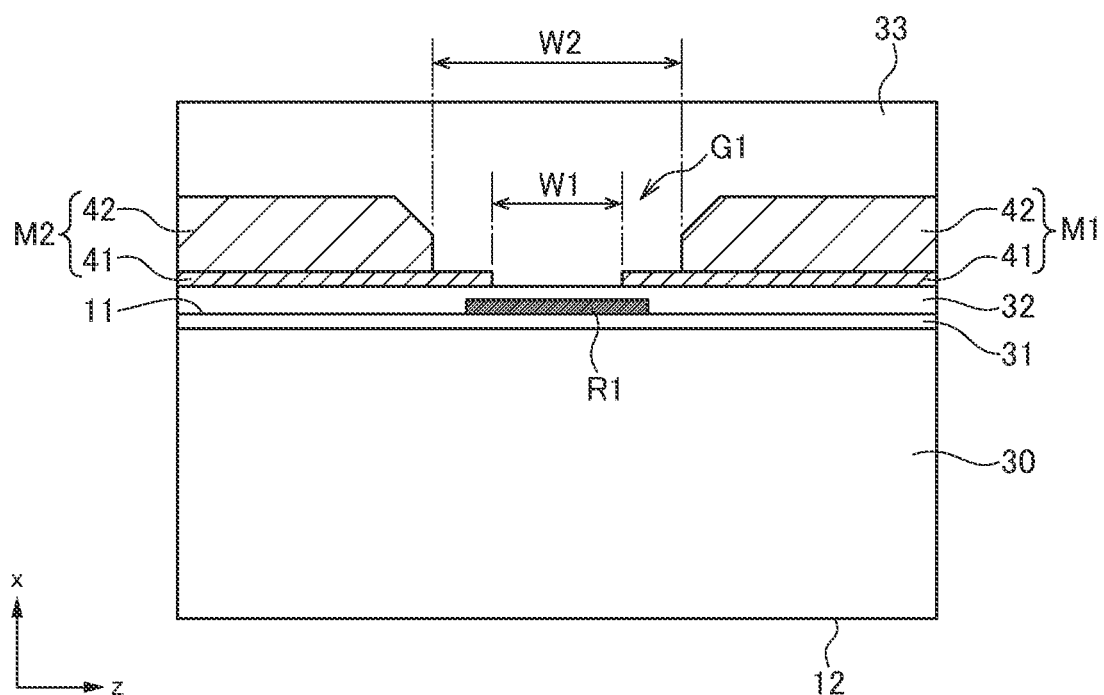
FIG. 5 is a schematic cross-sectional view of the sensor chip 10 according to a first modification.
Figure 6:
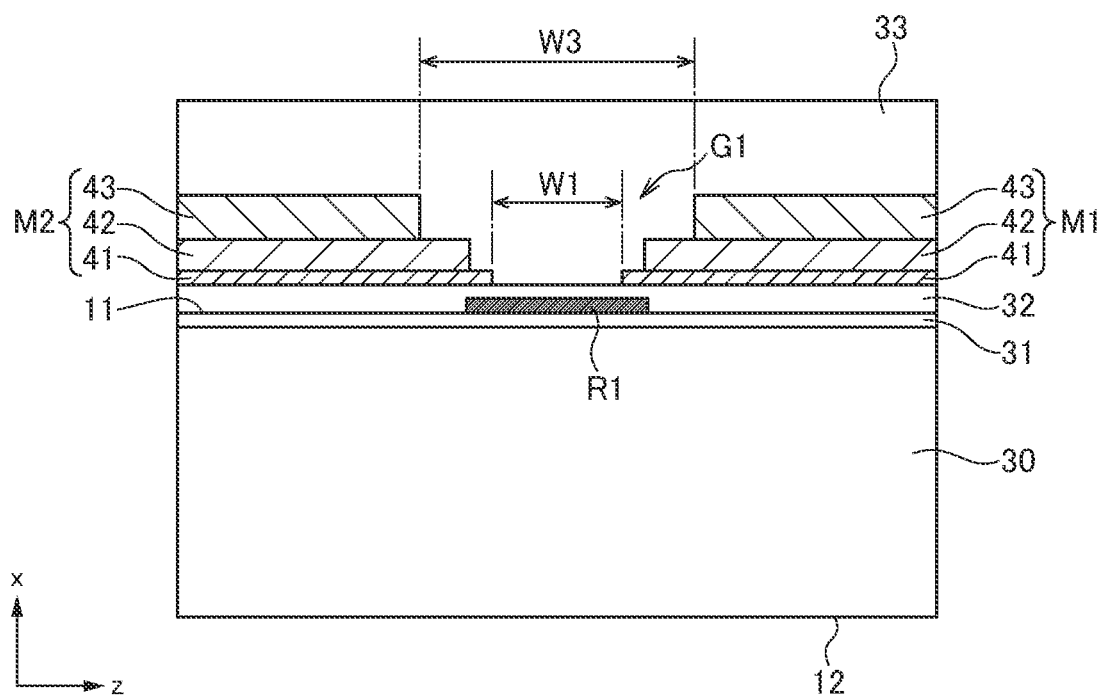
FIG. 6 is a schematic cross-sectional view of the sensor chip 10 according to a second modification.

Further, as illustrated in FIG. 5, the upper edge of the upper magnetic film 42 may be formed in a slope. With this configuration, the separation width W2 of each of the magnetic gaps G1 to G4 becomes larger toward the upper part, making it easier to fill the passivation film 33 in the magnetic gaps G1 to G4. Further, as illustrated in FIG. 6, another upper magnetic film 43 may be provided on the upper magnetic film 42. In this case, when the separation width in the z-direction between the adjacent upper magnetic films 43 constituting each of the magnetic gaps G1 to G4 is W3 which is larger than W2, the passivation film 33 is filled in the magnetic gaps G1 to G4 more easily. In this case as well, the lower magnetic film 41 uses a material having higher permeability than the upper magnetic films 42 and 43.

The following describes a manufacturing method for the sensor chip 10.

Figure 7:
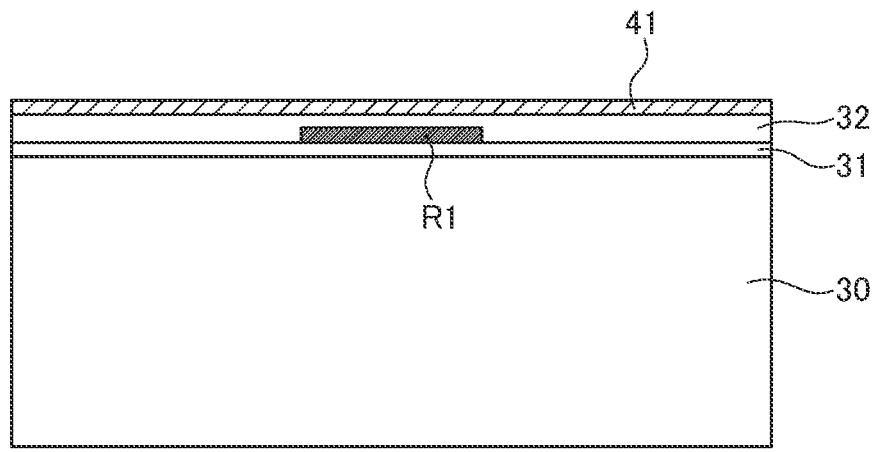
FIG. 7 is a process view for explaining the sensor chip 10.
Figure 8:
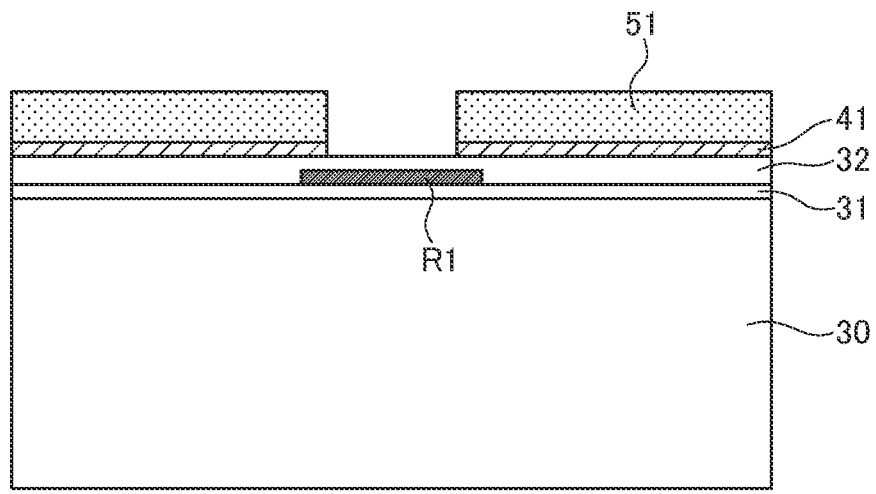
FIG. 8 is a process view for explaining the sensor chip 10.
Figure 9:
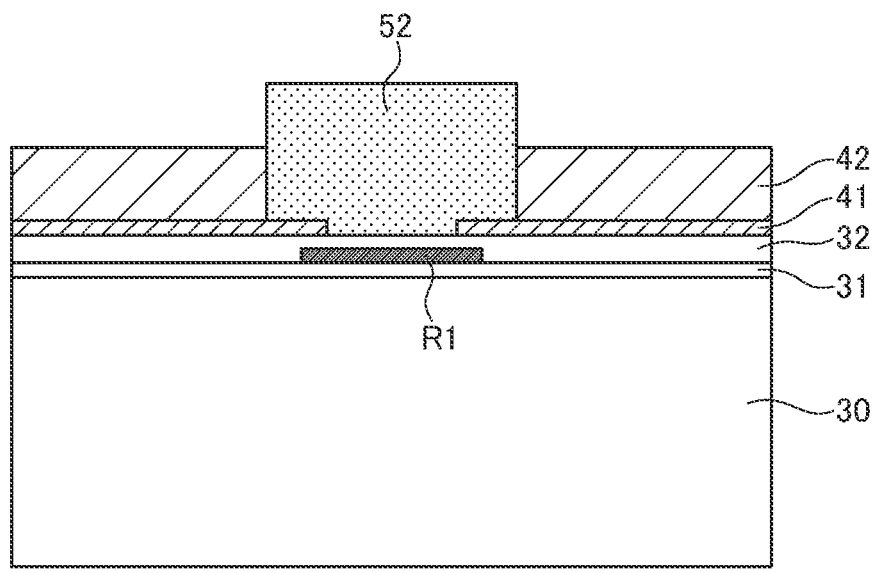
FIG. 9 is a process view for explaining the sensor chip 10.

FIGS. 7 to 9 are process views for explaining the sensor chip 10, which correspond to the cross section taken along the line A-A in FIG. 3.

Further, as illustrated in FIG. 7, after formation of the insulating film 31 on the substrate 30, the magnetosensitive elements R1 to R4 are formed on the surface of the insulating film 31 and are then covered with the insulating film 32. Then, the lower magnetic film 41 is formed on the entire surface of the insulating film 32 by a sputtering method. When the lower magnetic film 41 is thus formed by a sputtering method, the film thickness of the lower magnetic film 41 can be controlled with high accuracy. Then, as illustrated in FIG. 8, a mask 51 is formed on the lower magnetic film 41, and a part of the lower magnetic film 41 that is not covered with the mask 51 is removed by etching. As a result, the lower magnetic film 41 is separated into parts constituting respectively the ferromagnetic films M1 to M3. The mask 51 is formed by patterning using a photolithography method, so that high position accuracy can be achieved with respect to the magnetosensitive elements R1 to R4. Alternatively, the lower magnetic film 41 divided into parts constituting respectively the ferromagnetic films M1 to M3 may be formed by sputtering through a not-shown metal mask. In this case as well, the position accuracy of the lower magnetic film 41 is enhanced by aligning the metal mask with high accuracy.

Then, after removal of the mask 51, a resist 52 is formed as illustrated in FIG. 9. In this state, electrolytic plating is performed using the lower magnetic film 41 as a seed layer (power feeder) to form the upper magnetic film 42. Although the film formation by electrolytic plating is lower in position accuracy than by a sputtering method, it can obtain a sufficient film thickness in a short period of time. In addition, since electrolytic plating is performed using the lower magnetic film 41 as it is as a seed layer, a film made of another metal material is not left between the lower magnetic film 41 and the upper magnetic film 42. That is, the lower magnetic film 41 and the upper magnetic film 42 directly contact each other to make it possible to sufficiently reduce the magnetic resistance between the lower magnetic film 41 and the upper magnetic film 42.

Then, after removal of the resist 52, the passivation film 33 covering the ferromagnetic films M1 to M3 is formed so as to be filled in the magnetic gaps G1 to G4, whereby the sensor chip 10 to be used in the present embodiment is completed. The passivation film 33 is preferably formed by a sputtering method. This is because when the passivation film 33 is formed using a high-temperature process such as a CVD method, the magnetosensitive elements R1 to R4 are exposed to high temperatures, which may result in characteristic degradation of the magnetosensitive elements R1 to R4; on the other hand, when the passivation film 33 is formed using a sputtering method which is a low-temperature process, the characteristic degradation of the magnetosensitive elements R1 and R4 can be prevented. In another viewpoint, the sputtering method has worse coverage performance than the CVD method, so that when the magnetic gaps G1 to G4 are small, the magnetic gaps G1 to G4 are not completely filled with the passivation film 33, which may cause voids. However, in the present embodiment, the separation width W2 of each of the magnetic gaps G1 to G4 at the upper part thereof is increased to W2, and the film thickness of the lower magnetic film 41 constituting the separation width W1 is small, so that even when the sputtering method is used, the magnetic gaps G1 to G4 can be completely filled with the passivation film 33 without causing voids.

As described above, according to the present embodiment, the lower magnetic film 41 is formed by a sputtering method, and the upper magnetic film 42 is formed by electrolytic plating using the lower magnetic film 41 as a seed layer, so that the ferromagnetic films M1 to M3 having a reduced magnetic resistance can be manufactured with high position accuracy in a short period of time.

While the preferred embodiment of the present disclosure has been described, the present disclosure is not limited to the above embodiment, and various modifications may be made within the scope of the present disclosure, and all such modifications are included in the present disclosure.

REFERENCE SIGNS LIST 1 magnetic sensor
10 sensor chip
11 element forming surface 12 back surface
13-16 side surface
21, 22 external magnetic member
30 substrate
31, 32 insulating film
33 passivation film
41 lower magnetic film
42, 43 upper magnetic film
51 mask
52 resist
G1-G4 magnetic gap
M1-M3. M11, M12, M21, M22, M31, M32 ferromagnetic film
R1-R4 magnetosensitive element

What is claimed is:

1. A magnetic sensor comprising:
a magnetosensitive element whose magnetic sensing direction is a first direction;
an insulating film covering the magnetosensitive element;
first and second ferromagnetic films provided on the insulating film so as to be separated from each other; and
a passivation film provided on the first and second ferromagnetic films so as to fill a separated part between an end portion of the first ferromagnetic film and an end portion of the first ferromagnetic film,
wherein the magnetosensitive element overlaps the separated part in a plan view,
wherein each of the first and second ferromagnetic films includes a lower magnetic film provided on a surface of the insulating film and an upper magnetic film provided on the lower magnetic film,
wherein the separated part is configured such that a width in the first direction of the separated part between the upper magnetic films is larger than a width in the first direction of the separated part between the lower magnetic films, and
wherein a material of the lower magnetic film is higher in permeability than a material of the upper magnetic film.

2. The magnetic sensor as claimed in claim 1, wherein the lower magnetic film and the upper magnetic film directly contact each other not through a film made of another metal material.

3. A method for manufacturing a magnetic sensor, the method comprising:
a first step of covering a magnetosensitive element whose magnetic sensing direction is a first direction with an insulating film;
a second step of forming lower magnetic films of respective first and second ferromagnetic films on the insulating film using a sputtering method;
a third step of forming upper magnetic films of the respective first and second ferromagnetic films on the lower magnetic films of the respective first and second ferromagnetic films by electrolytic plating; and
a fourth step of forming a passivation film on the first and second ferromagnetic films,
wherein, in the second step, the lower magnetic film is formed such that one end portion of the magnetosensitive element in the first direction overlaps, in a plan view, the lower magnetic film of the first ferromagnetic film, that other end portion of the magnetosensitive element in the first direction overlaps, in a plan view, the lower magnetic film of the second ferromagnetic film, and that an area between the one end portion of the magnetosensitive element and the other end portion thereof does not overlap the lower magnetic films of the respective first and second ferromagnetic films, and
wherein, in the third step, the upper magnetic film is formed such that a separation width in the first direction between an end portion of the upper magnetic film of the first ferromagnetic film and an end portion of the upper magnetic film of the second ferromagnetic film is larger than a separation width in the first direction between an end portion of the lower magnetic film of the first ferromagnetic film and an end portion of the lower magnetic film of the second ferromagnetic film.

4. The method for manufacturing a magnetic sensor as claimed in claim 3, wherein, in the third step, the electrolytic plating is performed using the lower magnetic film as a seed layer.

5. The method for manufacturing a magnetic sensor as claimed in claim 3, wherein, in the fourth step, the passivation film is formed by a sputtering method.

6. The method for manufacturing a magnetic sensor as claimed in claim 3, wherein a material of the lower magnetic film is higher in permeability than a material of the upper magnetic film.

7. The method for manufacturing a magnetic sensor as claimed in claim 4, wherein, in the fourth step, the passivation film is formed by a sputtering method.

* * * * *